United States Patent [19]

Redmond et al.

[11] Patent Number: 4,923,404
[45] Date of Patent: May 8, 1990

[54] SEALED CHIP CARRIER

[75] Inventors: John P. Redmond, Mechanicsburg; Ray N. Shaak, Lebanon, both of Pa.

[73] Assignee: AMP Incorporated, Harrisburg, Pa.

[21] Appl. No.: 424,469

[22] Filed: Oct. 20, 1989

[51] Int. Cl.⁵ ............................................ H01R 9/09
[52] U.S. Cl. ...................................... 439/71; 439/73; 439/86; 439/264; 439/331; 174/52.4
[58] Field of Search ................... 174/52.4; 439/71, 73, 439/76, 86, 264–266, 320, 330, 331

[56] References Cited

U.S. PATENT DOCUMENTS

| | | | |
|---|---|---|---|
| 3,648,002 | 3/1972 | DuRocher | 200/166 C |
| 3,795,037 | 3/1974 | Luttmer | 29/628 |
| 3,795,884 | 3/1974 | Kotaha | 339/171 M |
| 3,861,135 | 1/1975 | Seeger, Jr. et al. | 58/50 R |
| 3,862,790 | 1/1975 | Davies et al. | 339/171 M |
| 3,960,423 | 6/1976 | Weisenburger | 439/331 |
| 3,985,413 | 10/1976 | Evans | 339/171 M |
| 4,003,621 | 1/1977 | Lamp | 339/59 M |
| 4,203,203 | 5/1980 | Gilissen et al. | 29/846 |
| 4,357,061 | 11/1982 | Crosby | 439/331 |
| 4,376,560 | 3/1983 | Olsson et al. | 439/331 |
| 4,390,220 | 6/1983 | Benasutti | 439/331 |
| 4,643,499 | 2/1987 | Mitchell | 439/71 |
| 4,692,790 | 9/1987 | Oyamada | 439/331 |
| 4,699,593 | 10/1987 | Grabbe et al. | 439/71 |
| 4,832,612 | 5/1989 | Grabbe et al. | 439/71 |

Primary Examiner—P. Austin Bradley
Attorney, Agent, or Firm—William B. Noll

[57] ABSTRACT

An environmentally sealed chip carrier housing for mounting on a printed circuit board. The housing is formed of a dielectric material and comprises a base and an upstanding circular side wall, one surface of which is threadably configured for receipt of a cover member. The base is further provided with plural slots for receiving a like plurality of elongated elastomeric compressive type connectors, and support means for receiving a chip carrier thereon. A cover member is provided for threadably engaging the housing. The cover member is characterized by a top having a peripheral wall thereabout, where the top has a uniformly convex configuration such that the center portion is thicker than the outer portions thereof. By this arrangement, when the cover member is positioned over the housing containing a chip carrier to threadably engage the cover member with said housing, a uniform pressure is applied to said chip carrier, which in turn will exert a uniform pressure against the elastomeric compressive type connectors. Further, the chip carrier is environmentally sealed.

6 Claims, 2 Drawing Sheets

SEALED CHIP CARRIER

BACKGROUND OF THE INVENTION

This invention is directed to an environmentally sealed chip carrier housing for mounting to a printed circuit board (PCB) in which the chip therein contained becomes electrically interconnected to conductive elements on said PCB. Within such housing plural elastomeric compressive type connectors are provided as the interconnection means between said chip and said PCB.

A typical chip carrier is fabricated from a thin ceramic member having metallized circuit pads extending along a surface to the sides thereof. An electronic circuitry chip is mounted on the ceramic carrier, where fine wires are bonded between the circuitry and the pads of the ceramic carrier. Such chip carrier may be mounted within a housing, as known in the art and more fully described hereinafter.

To replace soldering of the chip carrier to the PCB, this invention contemplates the use of an elastomeric compressive type connector. Such a connector may be selected from a variety of designed connectors, as known in the art. By way of reference, a thin laminated elastomeric contact is taught in U.S. Ser. No. 352,223, assigned to the assignee herein. The invention thereof comprises an elongated body having plural laminations of electrically conductive metal sheet interspersed between layers of insulating material, where said laminations are oriented in a direction perpendicular to the axis of said body and that each metal sheet is electrically exposed on opposite sides thereof so as to be capable of electrically interconnecting a pair of substrates, disposed in parallel relationship, such as a chip carrier and PCB.

Another type of a compressible contact is taught in U.S. Pat. No. 4,203,203 to Gilissen et al. Briefly, such patent teaches an electrical connector formed from lamina of elastomeric material having conductive tracks on one surface by folding the lamina and bonding opposed lamina portions together. The conductive tracks extend around the fold between contact portions on opposite surfaces of the connector. The connector is essentially U-shaped, and in use rests under pressure between the aforementioned opposed substrates.

U.S. Pat. No. 3,985,413 to Evans teaches a different connector of the compressible type. Specifically, such patent is directed to a miniature electrical connector for forming connections between conductors on parallel spaced apart substrates. The connector comprises a generally cylindrical elastomeric body having a thin non-yielding flexible circuit wrapped therearound. The circuit has parallel spaced apart conductors on its surface so that when the connector is positioned between the two parallel substrates and compressed between the substrates, the corresponding conductors on the substrates will be electrically connected by the conductors on the flexible circuit.

Further examples of such connectors are found in U.S. Pat. Nos. 3,648,002; 3,795,037; 3,795,884; 3,861,135; 3,862,790; 3,885,173 and 4,003,621.

U.S. Pat. No. 4,376,560, assigned to the assignee herein, teaches a carrier chip holder which includes a molded insulative base carrying rows of discrete, metal resilient electrical terminals. A leadless chip carrier initially is supported on the terminals, with the pads of the carrier engaging the terminals. A lid is placed over the carrier and is rotatably advanced to press against the carrier, causing the carrier to deflect resiliently the terminals, and to seat against the base. The lid clamps the carrier against the base and is adjustable to accommodate a carrier which varies in height within specified tolerances.

A further example of a carrier chip holder, but one utilizing elastomeric conductors is disclosed in U.S. Pat. No. 4,843,313.

Neither of the latter patents, nor the prior patents discussed above, teach an environmentally sealed chip carrier housing in the manner of this invention; nor, are means disclosed by which to achieve a controlled pressure or torque on the chip carrier when disposed within said housing. Such features, along with others described hereinafter, shall become apparent in the specification which follows.

SUMMARY OF THE INVENTION

This invention is directed to an environmentally sealed chip carrier housing for mounting on a printed circuit board. The chip carrier housing is formed of a dielectric material and comprises a base and an upstanding circular side wall, the outer surface of which is threadably configured for receipt of a cover member. The base is provided with plural slots for receiving a like plurality of elongated elastomeric compressive type connectors and shoulder means for supporting a chip carrier thereon. A cover member, threadably engageable with said housing is defined by a top with a peripheral wall thereabout, where said top has a uniformly convex configuration such that the center portion is thicker than the outer portions thereof. When such cover member is positioned over said housing containing a chip carrier, and engaged therewith, the cover member will provide a uniform pressure to said chip carrier which in turn will exert a uniform pressure against the elastomeric compressive type connectors contained within said housing base.

DETAILED DESCRIPTION OF PREFERRED EMBODIMENT

Figure 2:
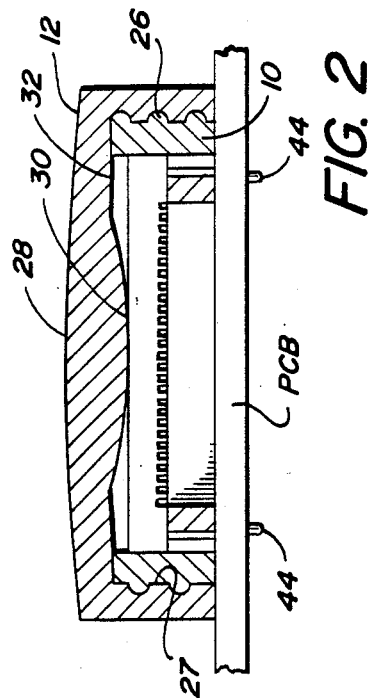
FIG. 2 is a sectional view of the assembly illustrated in FIG. 1.
Figure 1:
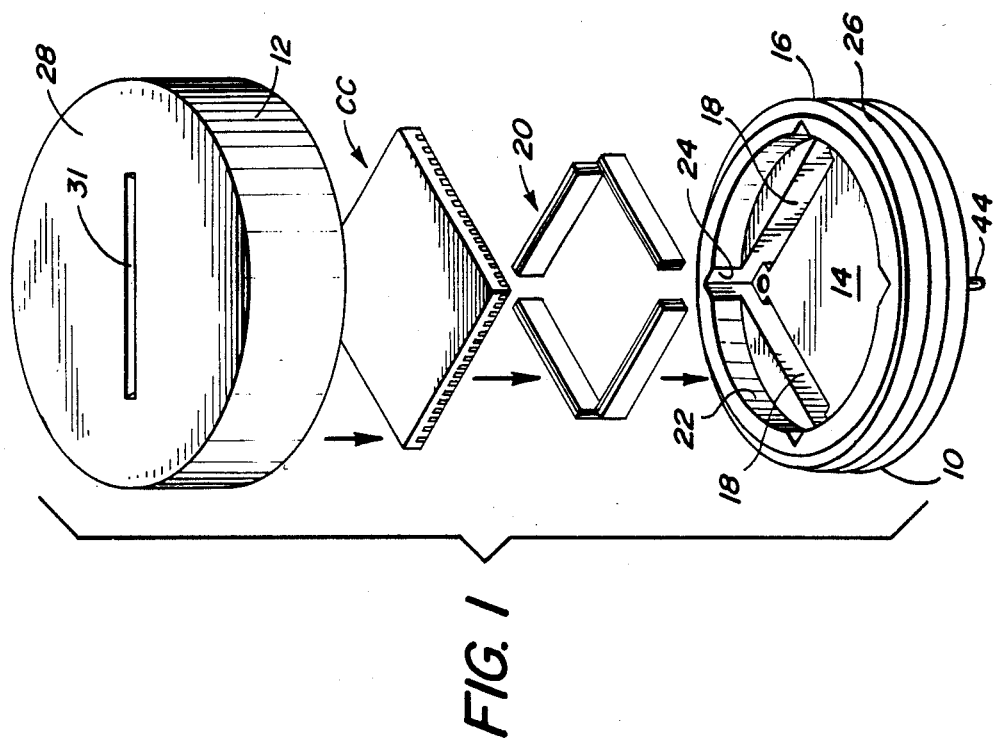
FIG. 1 is an exploded perspective view of a sealed chip carrier housing according to this invention, including a chip carrier therebetween suitable for mounting in said housing.

Referring now to the embodiment of this invention, as illustrated in FIGS. 1 and 2, the chip carrier housing comprises a base housing 10 and cover member 12. Such base, the design of which is best revealed in FIG. 1, includes a base or floor 14 with a circular upstanding wall 16 thereabout. The floor 14 is provided with plural through slots 12 for receiving an elongated elastomeric compressive type connector 20 (FIG. 3), as more fully described hereinafter.

A feature of the interior 22 of wall 16 is the provision of polarizing or positioning slots 24 to properly align a chip carrier (CC) within the base housing 10 relative to the circuitry of an underlying printed circuit board (PCB), see FIG. 2. Exteriorly, the wall 16 is threaded 26 for engagement with complementary threads 27 of cover member 12.

The cover member 12 is characterized by a top 28 which has a relatively uniform, convex configuration, or profile as shown in FIG. 2, such that the center portion 30 is thicker than the outer portions 32 thereof. With this configuration, the center portion 30, upon engagement of the cover member 12 to base housing 10, will exert a uniform pressure or torque against a suitably positioned CC therebelow. Such torque may be applied by the use of a hand tool, such as a screw driver inserted into slot 31, and turned. Further, by the interengagement of the complementary threads 26,27, sealing of the housing interior, and hence damage to the CC is prevented. Additionally, since the cover member 12 is not in electrical contact with the CC, such member may be metallic or of a heat conductive material, and thereby function as a heat sink.

Figure 3:
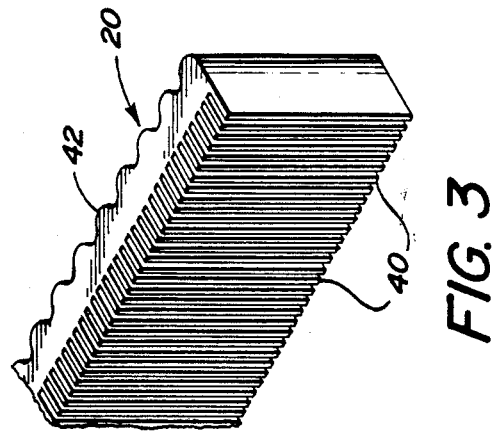
FIG. 3 is an enlarged partial perspective view of an elongated elastomeric compressive type suitable for use in the invention hereof.

FIG. 3 is illustrative of a type of elastomeric connector 20 that is suitable for practicing this invention. Along one side there are provided a plurality of contacts 40 isolated from adjacent contacts by insulative elastomeric material. The opposite side, for the embodiment, is scalloped 42 so as to allow for flexing thereof when inserted into slots 18 and compressed under application of the cover 12 to base housing 10. The height of the connector 20 must exceed the depth of the slots 18. Such height should be from 5 to 20% greater than the slot depth so as to allow for such compression. As known in the art, compressive connectors are ideally suited for surface mounting components to PC boards or flat panel displays. The component (display, chip carrier, etc.) is secured in the base housing 10 which is mounted by pins or screws 44 to the PC board. To insure proper orientation of the chip carrier housing to the PC board, one such pin or screw 44 may be of a different size.

As the cover 12 engages the housing 10 pressing the CC towards the elastomeric connectors 20, interconnection is made by the connector 20 just contacting the pads of the PC board and the pads on the component. Such engagement avoids distortion of the substrate, i.e. PC board, as the bulk of the pressure is being applied to the housing 12.

Figure 4:
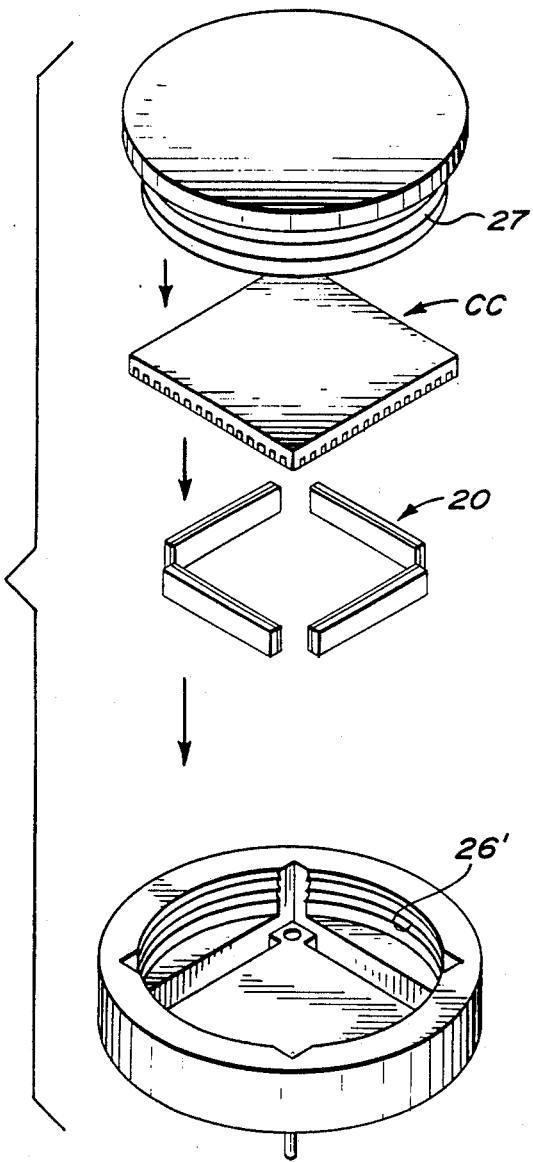
FIG. 4 is an exploded perspective view of an alternative embodiment of a sealed chip carrier housing according to this invention.

FIG. 4 is an alternative embodiment, similar to FIG. 1, but showing a cover externally threaded 27' so as to engage with internal threads 26' of the housing.

We claim:
1. An environmentally sealed chip carrier housing for mounting on a printed circuit board, comprising:
   a. a chip carrier housing formed of a dielectric material and comprising a base and an upstanding circular side wall, one surface of which is threadably configured for receipt of a cover member, said base being provided with plural slots for receiving a like plurality of elongated elastomeric compressive type connectors and shoulder means for supporting a chip carrier thereon, and
   b. a cover member for threadably engaging said housing, said cover member being defined by a top with a peripheral wall thereabout, where said top has a uniformly convex configuration such that the center portion is thicker than the outer portions thereof, whereby when said cover member is positioned over said housing containing a chip carrier, threadably engaging said cover member with said housing will provide a unifore pressure to said chip carrier which in turn will exert a uniform pressure against said elastomeric compressive type connectors.

2. The sealed chip carrier housing according to claim 1 wherein the outer surface of the circular side wall of said housing is threaded.

3. The sealed chip carrier housing according to claim 1, wherein the inside surface of the circular side wall of said housing is threaded.

4. The sealed chip carrier housing according to claim 1, wherein the vertical dimersion of said elongated elastomeric compressive type connectors is from 5 to 20% greater than the depth of said slots.

5. The sealed chip carrier housing according to claim 1, wherein said housing is provided with means for receiving a substrate.

6. The sealed chip carrier housing according to claim 1, wherein said cover is fabricated from a heat conductive material.

* * * * *

UNITED STATES PATENT AND TRADEMARK OFFICE
CERTIFICATE OF CORRECTION

PATENT NO. : 4,923,404

DATED : May 8, 1990

INVENTOR(S) : John Peter Redmond, Ray Ned Shaak

It is certified that error appears in the above-identified patent and that said Letters Patent is hereby corrected as shown below:

In claim 1, column 4, line 25, the word "unifore" should be --uniform--.

In claim 4, column 4, line 36, the word "dimersion" should be --dimension--.

Signed and Sealed this

Third Day of March, 1992

Attest:

HARRY F. MANBECK, JR.

*Attesting Officer*      *Commissioner of Patents and Trademarks*